(12) United States Patent
Usui (10) Patent No.: US 6,414,528 B1
(45) Date of Patent: Jul. 2, 2002

(54) CLOCK GENERATION CIRCUIT, SERIAL/PARALLEL CONVERSION DEVICE AND PARALLEL/SERIAL CONVERSION DEVICE TOGETHER WITH SEMICONDUCTOR DEVICE

(75) Inventor: Toshimasa Usui, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/720,429

(22) PCT Filed: Apr. 27, 2000

(86) PCT No.: PCT/JP00/02769

§ 371 (c)(1),
(2), (4) Date: Dec. 22, 2000

(87) PCT Pub. No.: WO00/65717

PCT Pub. Date: Nov. 2, 2000

(30) Foreign Application Priority Data

Apr. 27, 1999 (JP) .......................................... 11-119647

(51) Int. Cl.[7] .................................................. H03L 7/06
(52) U.S. Cl. ........................ 327/158; 327/407; 327/415; 327/161
(58) Field of Search ................................. 327/158, 407, 327/415, 147, 149, 152, 153, 161, 270, 271, 284

(56) References Cited

U.S. PATENT DOCUMENTS 4,494,021 A * 1/1985 Bell et al. .................... 327/262
4,922,141 A 5/1990 Lofgren et al. ............... 327/158
5,614,868 A 3/1997 Nielson ........................ 331/1 A
6,046,994 A * 4/2000 Fechalos et al. ............. 370/366
6,198,415 B1 * 3/2001 Yoshikawa et al. .......... 341/100
6,271,730 B1 * 8/2001 Abe et al. ...................... 331/34

FOREIGN PATENT DOCUMENTS

| JP | A 59-63822 | 4/1984 |
| JP | A 60-101799 | 6/1985 |
| JP | A 4-72910 | 3/1992 |
| JP | A 9-74339 | 3/1997 |
| JP | A 10-303743 | 11/1998 |

* cited by examiner

Primary Examiner—Timothy P. Callahan
Assistant Examiner—Cassandra Cox
(74) Attorney, Agent, or Firm—Oliff & Berridge, PLC (57) ABSTRACT

A clock generation circuit that generates multi-phase output clock signals which immediately follow any change in the period of an input clock signal. This clock generation circuit comprises a voltage-controlled oscillator (14) that generates an output signal having a frequency that varies in response to a control voltage; a phase comparator (11) that compares the phase of the input clock signal and the phase of the output signal of the voltage-controlled oscillator, to detect the phase difference therebetween; control voltage generation circuits (12, 13) that generate a control voltage corresponding to that phase difference; and a variable delay circuit (15) that generates multi-phase output clock signals by delaying the input clock signal in accordance with the control voltage.

11 Claims, 13 Drawing Sheets

CLOCK GENERATION CIRCUIT, SERIAL/PARALLEL CONVERSION DEVICE AND PARALLEL/SERIAL CONVERSION DEVICE TOGETHER WITH SEMICONDUCTOR DEVICE

TECHNICAL FIELD

The present invention relates to a clock generation circuit that uses a phase locked loop (PLL) to generate multi-phase clock signals, as well as a serial/parallel conversion device, a parallel/serial conversion device, and a semiconductor device.

BACKGROUND ART

In general, it can happen that a data signal and a clock signal are transmitted separately between a transmitter and receiver that use low-voltage differential signals (LVDS). In such a case, the configuration is such that the rise of the clock signal is always matched to a change in the data signal. There is therefore a requirement to generate a clock signal that ensures that the timings of the data signal and the clock signal match, particularly at the receiver.

Figure 10:
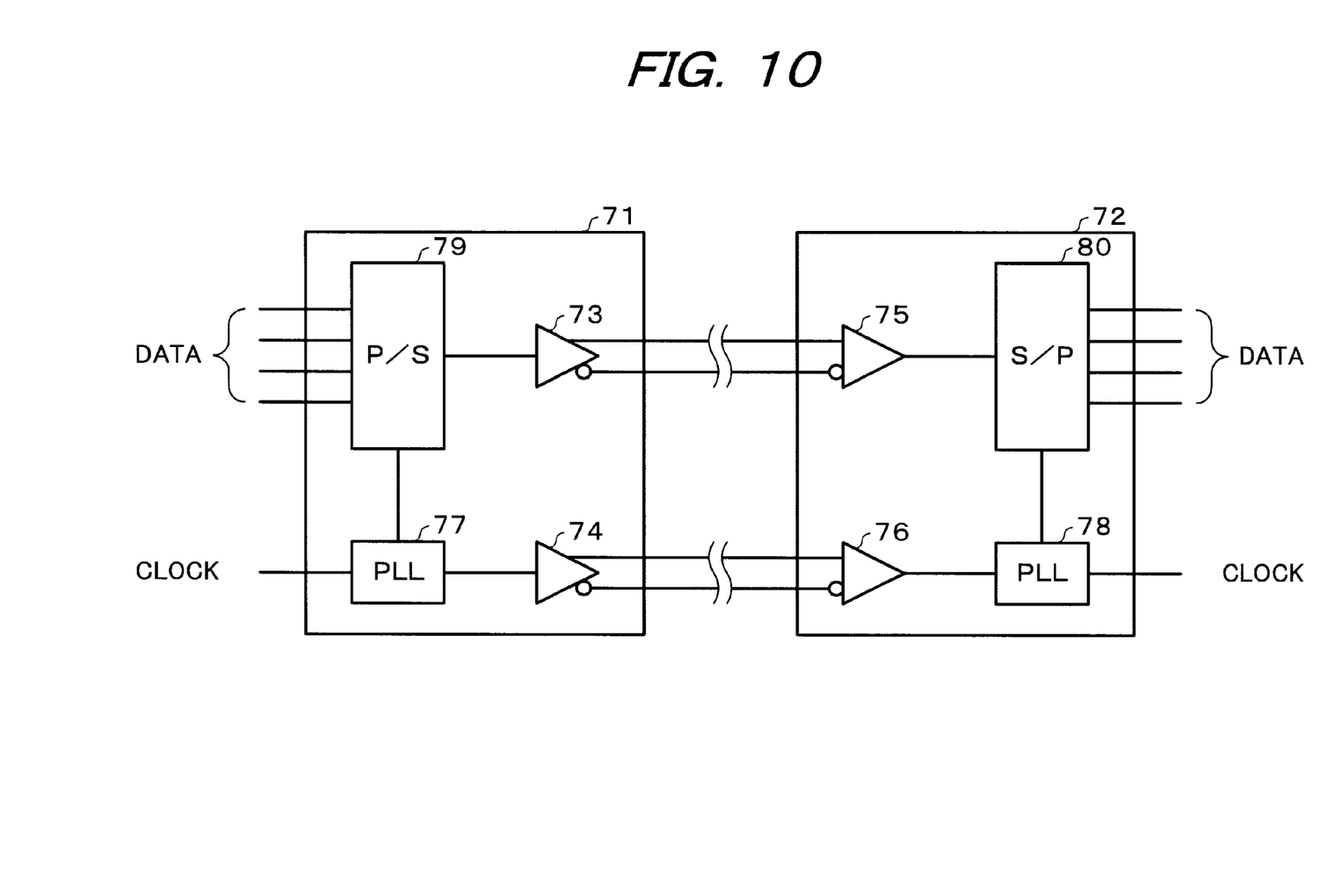
FIG. 10 is a block diagram of an ordinary transmitter and receiver.
Figure 11:
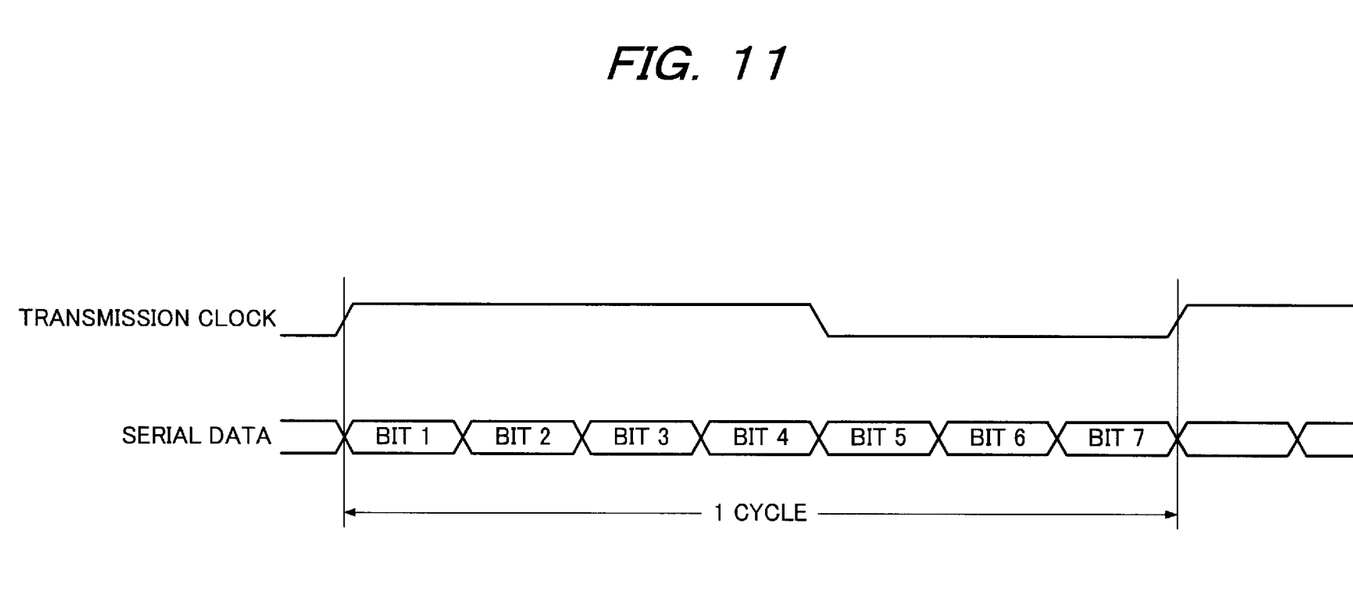
FIG. 11 shows the waveforms of a transmission clock and serial data that are transferred from the transmitter to the receiver.

A block diagram of an ordinary transmitter and receiver is shown in FIG. 10. A transmission clock signal and serial data that are transferred from a transmitter 71 to a receiver 72 are shown in FIG. 11. The serial data shown in FIG. 11 is data which is sent within one cycle of the transmission clock and which comprises 7 bits, by way of example. In other words, the serial data assumes a transmission rate that is seven times the frequency of the transmission clock, so that the transmission rate of the serial data will be 455 Mbps when the frequency of the transmission clock is 65 MHz.

The description first concerns the operation of the transmitter 71. The clock signal that is input to the transmitter 71 is increased sevenfold within a PLL block 77. Parallel data that is input to the transmitter 71 is converted into the serial data shown in FIG. 11 within a parallel/serial conversion block 79, based on this sevenfold sampling clock, then is sent to the receiver 72 as an LVDS signal from an LVDS output cell 73. The transmission clock shown in FIG. 11 is output from another LVDS output cell 74. This transmission clock has a frequency that is preferably one-seventh that of the sevenfold sampling clock, but the input clock signal could equally well be output unchanged.

The description now turns to the operation of the receiver 72. The clock signal that has been input to the receiver 72 is sent through an LVDS input cell 76 to a PLL block 78, where it is increased sevenfold. Serial data that has been input to the receiver 72 is sent through another LVDS input cell 75 to a serial/parallel conversion block 80, where it is converted into parallel data, based on the sevenfold sampling clock.

Instead of using PLL to generate the sampling clock, which has a frequency seven times that of the input clock, in the transmitter 71 and the receiver 72, seven-phase clock signals could be generated by PLL to have phases delayed by one-seventh the period of the input clock signal, then that seven-phase clock signals could be used as sampling clocks (refer to related applications such as Japanese Patent Application Laid-Open No. 9-74339).

To ensure synchronization between the clock signal and the data signal in the above described data transfer method, it is necessary to operate in such a manner that the rise of the clock signal that is an LVDS output always coincides with a change-point of the data signal. The rise in the clock signal must always be matched against the change-points in the data signal, even if there is a change in the period of the clock signal that is input to the transmitter 71.

Figure 12:
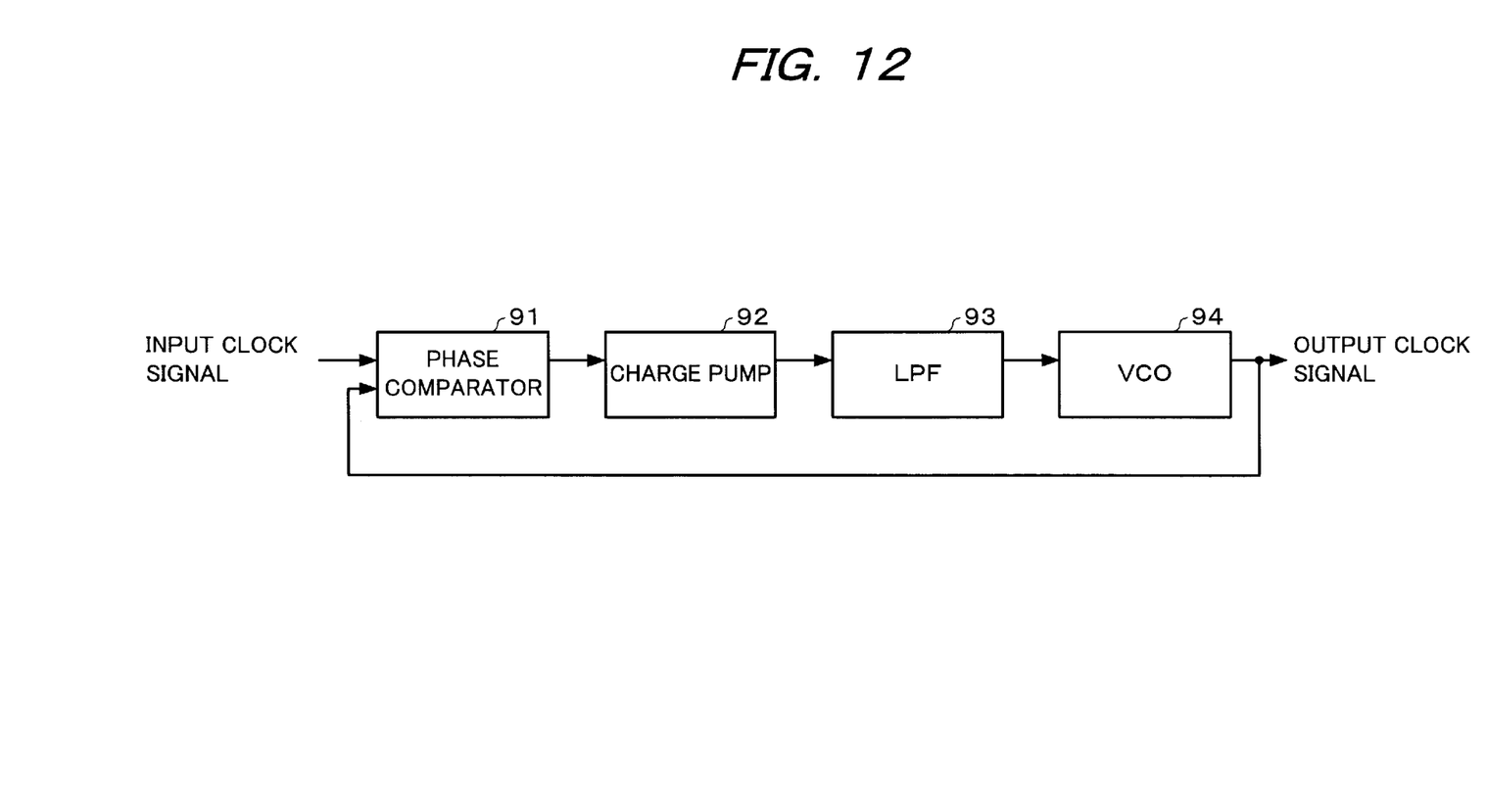
FIG. 12 is a block diagram of a conventional clock generation circuit.

A block diagram of the PLL circuit used for generating the clock signal in the receiver of FIG. 10, that is, a conventional clock generation circuit, is shown in FIG. 12. A voltage-controlled oscillator (VCO) 94 generates an output clock signal that oscillates at a frequency corresponding to a control voltage. The phase of the output clock signal generated by the VCO 94 is compared with the phase of the input clock signal in a phase comparator 91, and an error signal is generated in accordance with this phase difference. This error signal is integrated by a charge pump 92 and a low-pass filter (LPF) 93 and is applied to the VCO 94 as a control voltage.

Note that, in order to generate the seven-phase sampling clocks in the PLL circuit shown in FIG. 12, the VCO 94 is a ring oscillator which is configured of seven stages of differential buffers and the seven-phase sampling clocks can be obtained from the outputs of the differential buffers at each stage. The output of the final-stage differential buffer is fed back to the phase comparator 91.

To generate a clock signal that can reduce electro magnetic interface (EMI) noise, a method called a spread spectrum is used. With this method, the frequency of the clock signal is deliberately varied, to broaden the distribution of frequencies.

Figure 13:
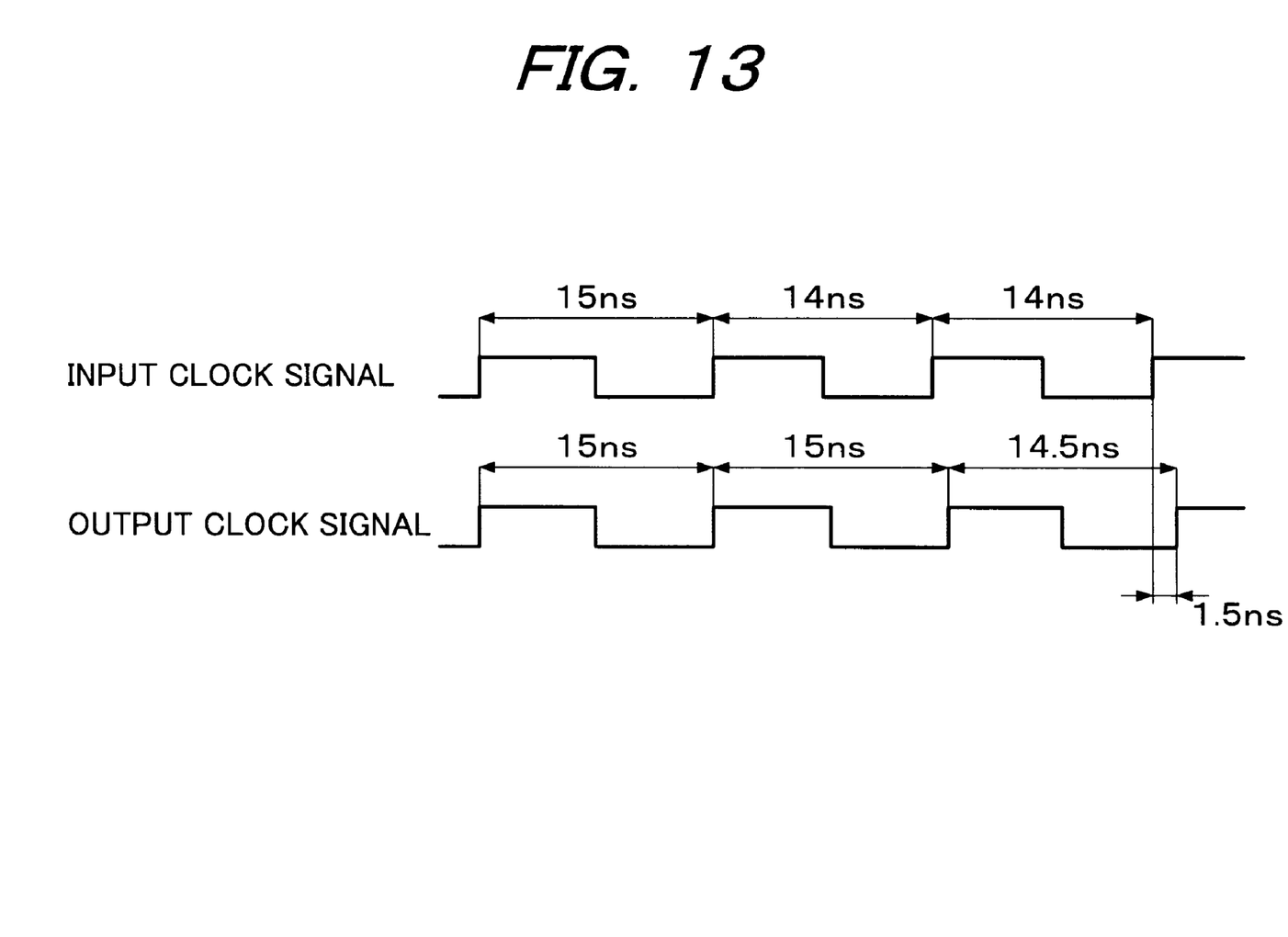
FIG. 13 shows the capability of the output clock signal to follow changes in the period of the input clock signal in the conventional clock generation circuit.

A chart showing the capability of the output clock signal to follow changes in the period of the input clock signal in the conventional clock generation circuit is shown in FIG. 13. The output clock signal of the clock generation circuit is unable to follow the period of the input clock signal directly, when it is varied in accordance with the spread spectrum between 15 ns and 14 ns, and changes slowly from 15 ns to 14.5 ns after a delay. During this time, the phase difference between the input clock signal and the output clock signal can reach 1.5 ns.

When the period of the input clock signal is 14 ns, the time width for one bit of data within the serial data used in the transfer is 2 ns. If the phase difference with respect to the output clock signal from the clock generation circuit is 1.5 ns during this time, the time margin between the serial data signal and the clock signal that is output from the clock generation circuit is reduced to no more than 0.5 ns.

Since it is necessary to ensure that the rise of the transmission clock always matches a change-point in the data during data transfer using LVDS, this large phase difference between the input clock signal and the output clock signal of the clock generation circuit causes a problem.

Phase difference, called jitter, can also occur in the input clock signal. This phase difference is on the order of 300 to 400 ps, but it causes a problem in that the output of the VCO cannot follow this jitter.

An objective of the present invention is to provide a clock generation circuit that generates multi-phase output clock signals which immediately follow any change in the period of an input clock signal, as well as a serial/parallel conversion device, a parallel/serial conversion device, and a semiconductor device using the same.

DISCLOSURE OF THE INVENTION

A clock generation circuit in accordance with one aspect of the present invention, which generates multi-phase output clock signals based on an input clock signal, comprises:

a voltage-controlled oscillator which oscillates an output signal having a frequency that varies in accordance with a control voltage;

a phase comparator which compares the phase of the input clock signal and the phase of the output signal of the voltage-controlled oscillator, to detect a phase difference therebetween;

a control voltage generation circuit which generates the control voltage in accordance with the phase difference detected by the phase comparator; and a variable delay circuit which generates the multi-phase output clock signals by delaying the input clock signal in accordance with the control voltage.

With this aspect of the present invention, the multi-phase output clock signals are not output from the voltage-controlled oscillator, but they are output by a variable delay circuit having a delay determined by the same voltage as the control voltage applied to the voltage-controlled oscillator. This variable delay circuit delays the input clock signal by an amount determined by the control voltage, thus making it possible to generate multi-phase output clock signals that directly follow any change in the period of the input clock signal.

In this case, the voltage-controlled oscillator may comprise a plurality of differential buffer circuits connected in a ring shape. This variable delay circuit may comprise a plurality of differential buffer circuits having the same configuration as the plurality of differential buffer circuits that are comprised with the voltage-controlled oscillator. In addition, if the voltage-controlled oscillator has n of these differential buffer circuits, the variable delay circuit can have at least 2n of these differential buffer circuits. This configuration makes it possible to generate an n-phase output clock signal having phase differences (T/n) obtained by dividing one cycle (T) of the input clock signal into substantially n parts.

The multi-phase output clock signals may be generated on the basis of outputs from odd-numbered differential buffer circuits from among the at least 2n differential buffer circuits, or they may be generated on the basis of outputs from even-numbered differential buffer circuits from among the at least 2n differential buffer circuits.

The voltage-controlled oscillator and the variable delay circuit may be formed on the same semiconductor substrate. This makes it possible to cancel out any variations between the differential buffer circuits configuring the voltage-controlled oscillator and the variable delay circuit, increasing the capability of the device to follow changes in the period of the input clock signal.

Another aspect of the present invention relates to a serial/parallel conversion device and a parallel/serial conversion device both comprising the above described clock generation circuit. The use of multi-phase output clock signals as sampling clocks necessary for the conversion performed thereby makes it possible for the device to follow any change in the period of the input clock signal directly, thus matching the rise of the sampling clock to changes in the data.

A further aspect of the present invention relates to a semiconductor device wherein a voltage-controlled oscillator and a variable delay circuit used in a serial/parallel conversion device or a parallel/serial conversion device are formed on the same semiconductor substrate. This semiconductor device is capable of implementing highly accurate serial/parallel conversion or parallel/serial conversion.

BEST MODE FOR CARRYING OUT THE INVENTION

Figure 1:
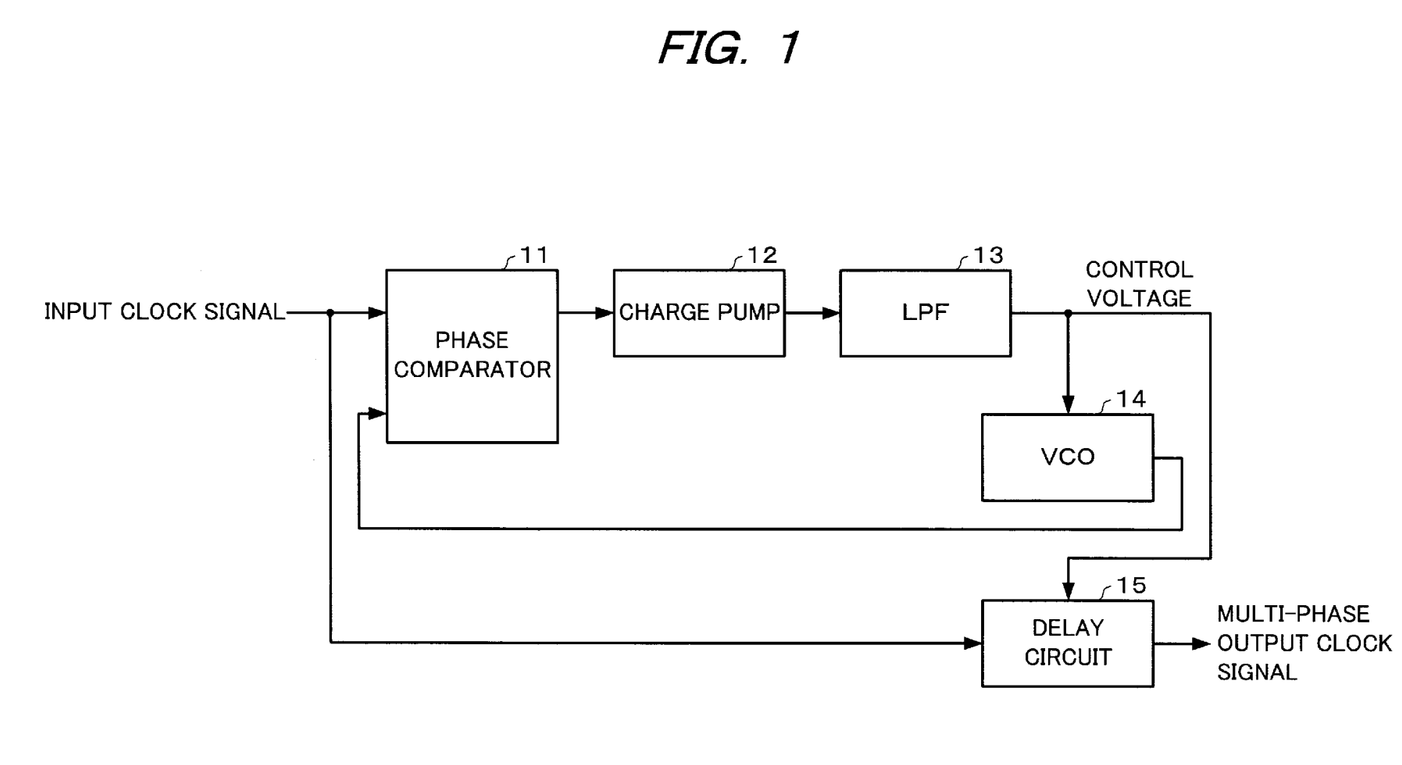
FIG. 1 is a block diagram of a clock generation circuit in accordance with one embodiment of the present invention.

Embodiments of the present invention will now be described with reference to the accompanying figures. A block diagram of a clock generation circuit in accordance with a first embodiment of this invention is shown in FIG. 1. Note that the clock generation circuit shown in FIG. 1 can be used in both the PLL block 77 of the transmitter 71 and the PLL block 78 of the receiver 72 shown in FIG. 10. In this embodiment of the invention, the transmitter 71 of FIG. 10 is mounted in an IC chip and, in a similar manner, the receiver 72 of FIG. 10 is mounted in another IC chip. The transmitter 71 of FIG. 10 is mounted in the main body of a notebook-style personal computer and the receiver 72 of FIG. 10 is mounted in a liquid crystal display of this notebook-style personal computer, by way of example.

In FIG. 1, a voltage-controlled oscillator (VCO) 14 oscillates at a frequency in accordance with a control voltage. A phase comparator 11 compares the phase of an output signal from the VCO 14 and the phase of the input clock signal, to detect the phase difference therebetween, and generates an error signal corresponding to that phase difference. This error signal is integrated by a charge pump 12 and a low-pass filter (LPF) 13. The voltage from this LPF 13 is applied as a control voltage to the VCO 14 and a delay circuit 15.

Note that in this embodiment of the present invention, multi-phase clock signals (to be described later) output from the delay circuit 15 are the output of the clock generation circuit, and the output of the VCO 14 is simply re-input back to the phase comparator 11. The charge pump 12 and the LPF 13 together configure a control voltage generation circuit that generates the previously described control voltage in correspondence with the phase difference detected by the phase comparator 11. The charge pump 12 of this embodiment adjusts the amount of electrical charge and discharge with respect to the capacity, based on the signal from the phase comparator 11, thus adjusting the output voltage.

Figure 2:
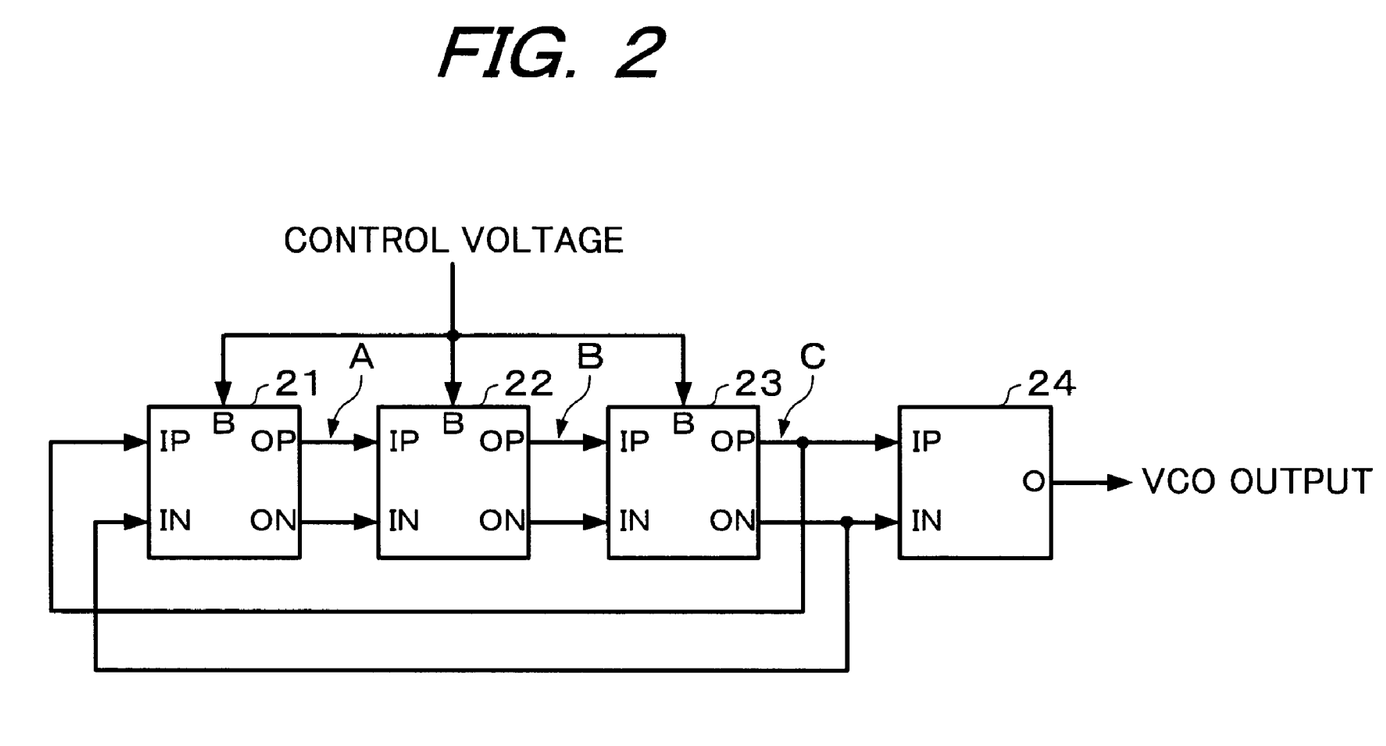
FIG. 2 shows an example of the configuration of the VCO circuit used in the clock generation circuit of FIG. 1.

An example of the circuit configuration of the VCO 14 is shown in FIG. 2. This VCO 14 is a ring oscillator formed of a plurality of differential buffer circuits connected together in a ring. In this case, three differential buffer circuits 21, 22, and 23 are used, to simplify the description. Note that if one cycle of the input clock signal comprises seven bits of data, as shown in FIG. 11, the number of differential buffer circuits forming the ring oscillator will be seven. An output buffer circuit 24 for converting the differential signal into an ordinary signal is connected to the output of the final-stage differential buffer circuit 23. The output of this output buffer circuit 24 is input back to the phase comparator 11.

Figure 4:
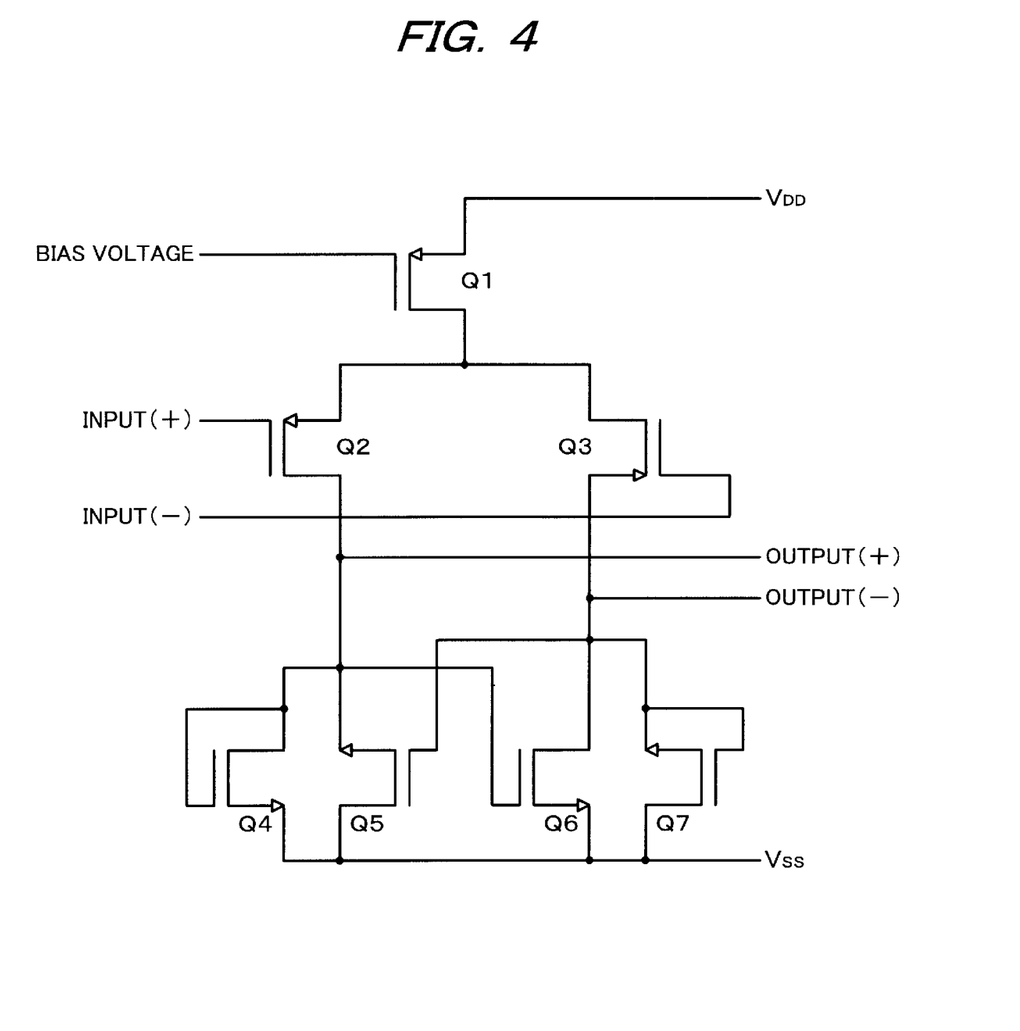
FIG. 4 shows an example of the differential amplification circuit used in the VCO of FIG. 2 and the delay circuit of FIG. 3.

Each of the differential buffer circuits 21, 22, and 23 can be configured as shown in FIG. 4, by way of example. Reference numbers Q1 to Q3 in FIG. 4 denote p-channel transistors and reference numbers Q4 to Q7 denote n-channel transistors. A high-tension power potential VDD and a low-tension power potential VSS are applied to the differential buffer circuit, but either of these could be replaced by the ground potential. A bias voltage (the control voltage from the LPF 13) is applied to the gate of the transistor Q1, the ON-resistance of that transistor Q1 is varied by that bias voltage, a delay time between input and output is varied by this variation in the ON-resistance, and thus the oscillation frequency of the VCO is varied by this variation in delay time between input and output.

Figure 3:
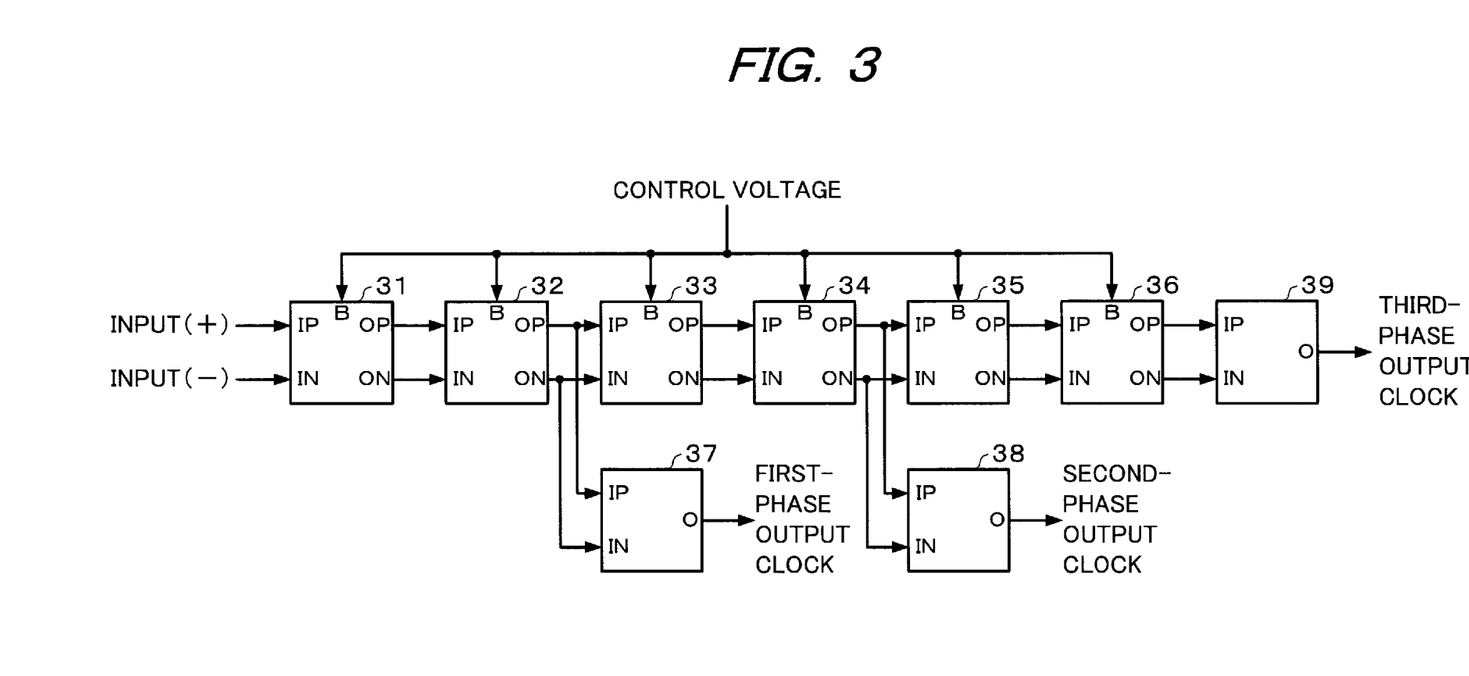
FIG. 3 shows an example of the circuit configuration of the delay circuit used in the clock generation circuit of FIG. 1.

An example of the circuit configuration of the delay circuit 15 is shown in FIG. 3. The delay circuit 15 generates three-phase output clock signals obtained by delaying the input clock signal by an amount determined by the control voltage from the LPF 13. This delay circuit 15 comprises differential buffer circuits 31 to 36, each of the same configuration as those shown in FIG. 4 and used in the VCO 14. In each of these differential buffer circuits 31 to 36, the bias voltage (the control voltage from the LPF 13) is applied to the gate of the transistor Q1 of FIG. 4, the ON-resistance of that transistor Q1 is varied by that bias voltage, and thus the delay between input and output is varied. The differential buffer circuits 31 to 36 therefore sequentially delay the input clock signal.

The delay circuit 15 uses twice as many differential buffer circuits as the VCO 14, where these differential buffer circuits are of the same configuration as those shown in FIG. 4. In other words, if the VCO 14 is provided with three differential buffer circuits 21 to 23, the delay circuit 15 is provided with at least twice as many, such as six differential buffer circuits 31 to 36.

Figure 5:
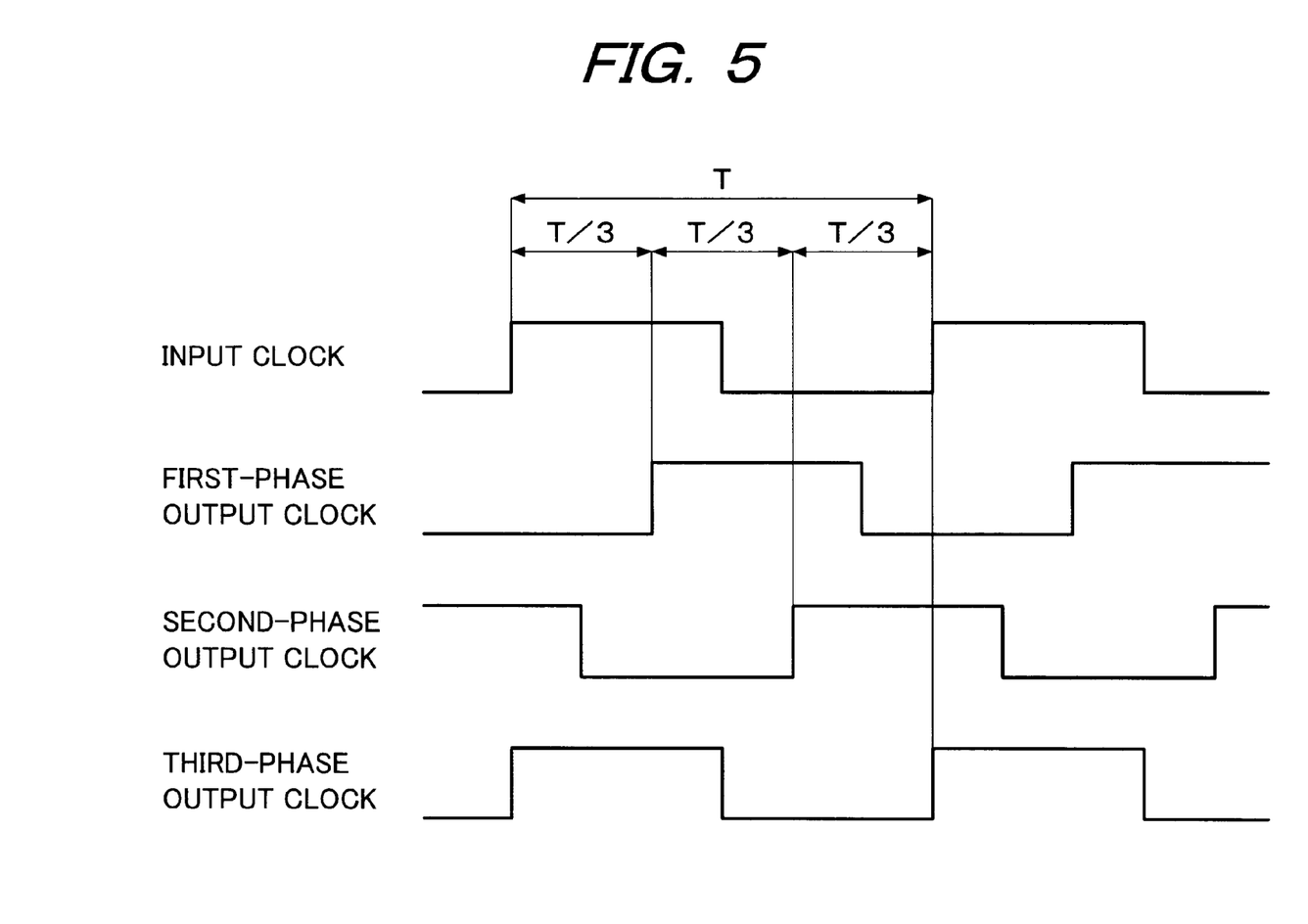
FIG. 5 shows the relationship between the input clock signal and the multi-phase output clock signals that are output from the delay circuit of FIG. 3.

As shown in FIG. 3, output lines of the even-numbered differential buffer circuits 32, 34, and 36 of the six differential buffer circuits 31 to 36 are connected to one each of output buffer circuits 37, 38, and 39, for converting the differential signals output therefrom into ordinary signals. As shown in FIG. 5, first-phase to third-phase output clock signals which are sequentially delayed in steps of T/3 can be obtained from these output buffer circuits 37, 38, and 39, where T is the period of the input clock signal.

Figure 6:
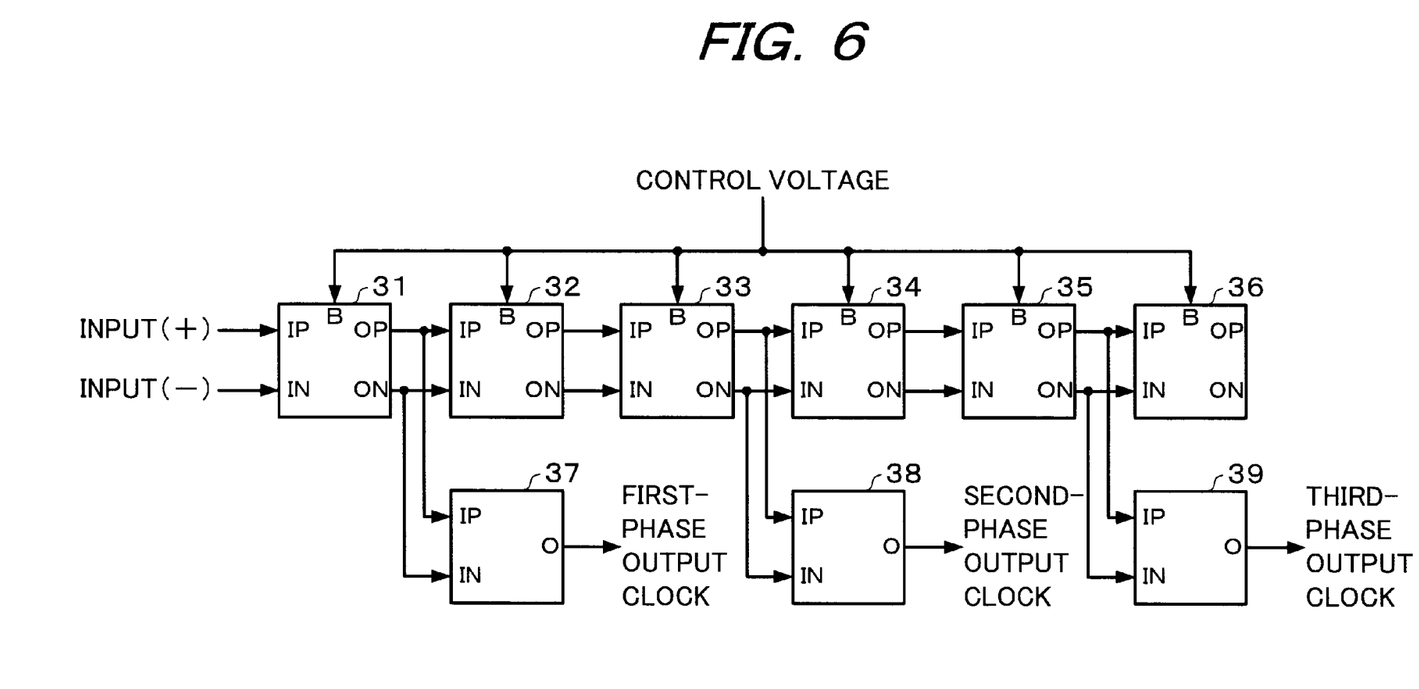
FIG. 6 shows another example of the circuit configuration of the delay circuit used in the clock generation circuit of FIG. 1.
Figure 7:
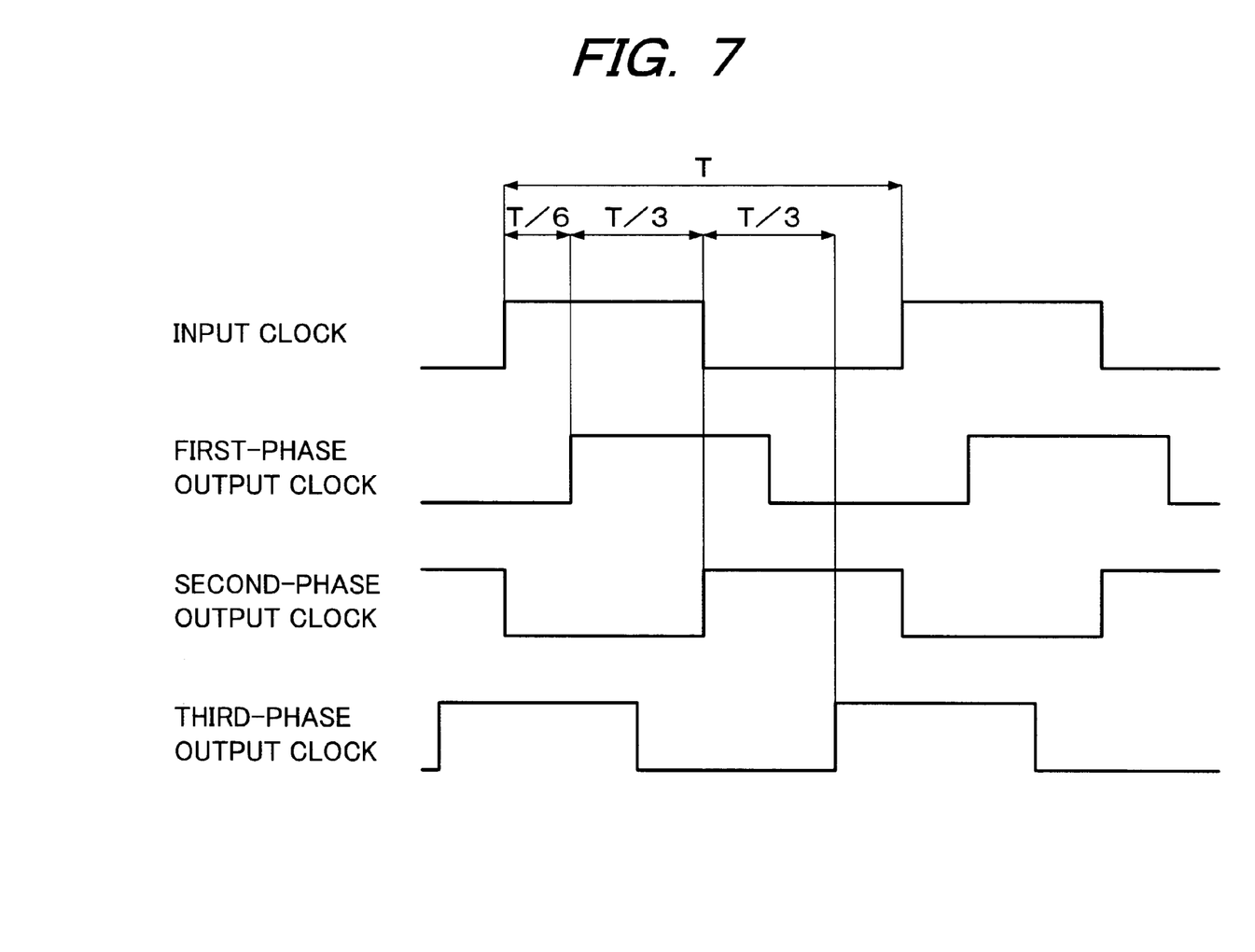
FIG. 7 shows the relationship between the input clock signal and the multi-phase output clock signals that are output from the delay circuit of FIG. 6.

The delay circuit 15 of FIG. 3 can be configured as shown in FIG. 6. In FIG. 6, output lines of the odd-numbered differential buffer circuits 31, 33, and 35 of the six differential buffer circuits 31 to 36 are connected to one each of output buffer circuits 37, 38, and 39, for converting the differential signals output therefrom into ordinary signals. A first-phase output clock signal that is delayed by T/6 from the input clock signal is obtained from the output buffer circuit 37, as shown in FIG. 7, and the delays between each of the first-phase and second-phase output clock signals and the second-phase and third-phase output clock signals is T/3. Note that the output of the differential buffer circuit 36 of FIG. 6 is not used, but this differential buffer circuit 36 is connected to the output line of the differential buffer circuit 35 to ensure that the output loads on each of the differential buffer circuits 31 to 35 are the same.

In this case, if it is assumed that the bias voltage shown in FIG. 4 (the control voltage applied to the VCO 14 and the delay circuit 15) is fixed and there no variations are introduced during the construction of the differential buffer circuits shown in FIGS. 2 and 3, the signal delays at each of the differential buffer circuits of FIGS. 2 and 3 are fixed at Tpd.

Figure 8:
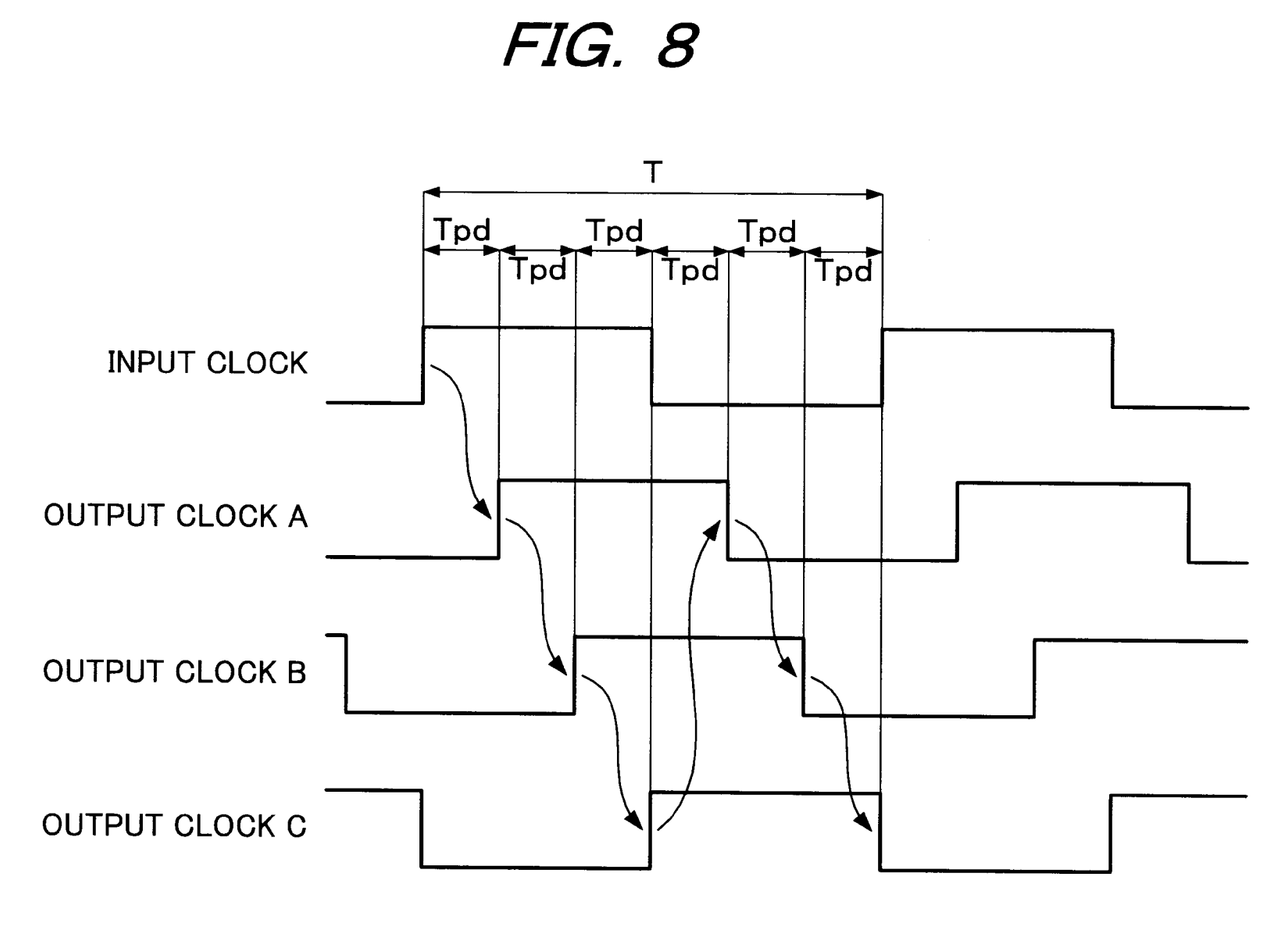
FIG. 8 is a waveform chart illustrating the operation of the VCO of FIG. 2.

To extract the output clock signal for one cycle from the VCO 14 of FIG. 2, it is necessary to have two circuits of the three differential buffer circuits 21 to 23 that are connected into a ring. In other words, the rise of an output clock A from the differential buffer circuit 21 of FIG. 2 is delayed by the time Tpd from the input clock signal, as shown in FIG. 8. Similarly, the rise of an output clock B from the differential buffer circuit 22 of FIG. 2 is delayed by the time Tpd from the output clock A, as shown in FIG. 8. Furthermore, the rise of an output clock C from the differential buffer circuit 23 of FIG. 2 is delayed by the time Tpd from the output clock B, as shown in FIG. 8. The falls of each output clock A to C have similar phase differences. In other words, if the number of stages of differential buffers in the VCO 14 is n, one cycle T of the input clock cycle is in the relationship: $T=2 \times n \times Tpd$.

Thus, if it is required to obtain an n-phase output clock signal having a phase difference which is equal to the time period obtained by dividing the period T of the input clock signal is divided by n, the delay circuit 15 must have at least 2n differential buffer circuits of the same configuration as those used in the VCO 14, which is at least twice the number used in the VCO 14.

As described previously, it is possible to control the delay time of the delay circuit 15 to match the input clock signal, by ensuring that the differential buffer circuits that form the VCO 14 and the delay circuit 15 have the same configuration, as shown in FIG. 4, and also by applying the control voltage that is applied to the VCO 14 to the delay circuit 15 as well. It is also possible to cancel out any variations in the components and ensure common environmental temperatures, thus increasing the following capability of the operation of those circuits, by fabricating the VCO 14 and the delay circuit 15 on the same semiconductor substrate.

As shown in FIG. 1, the VCO 14 forms a PLL block in which are assembled the phase comparator 11, the charge pump 12, and the LPF 13. If the period of the input clock signal varies, it takes a certain time to follow that change in the period of the input clock signal, in accordance with the delays between circuit elements within the loop. Any error in the period between the input clock signal and the output clock signal is therefore integrated so that the phase error increases in a cumulative manner. Although errors that are similar to those in the delay times of the VCO 14 are generated in the delay times of the delay circuit 15, it is possible to follow changes in the phase of the input clock signal directly by supplying the input clock signal directly to the delay circuit 15 and delaying that input clock signal by an amount determined by the control voltage.

Figure 9:
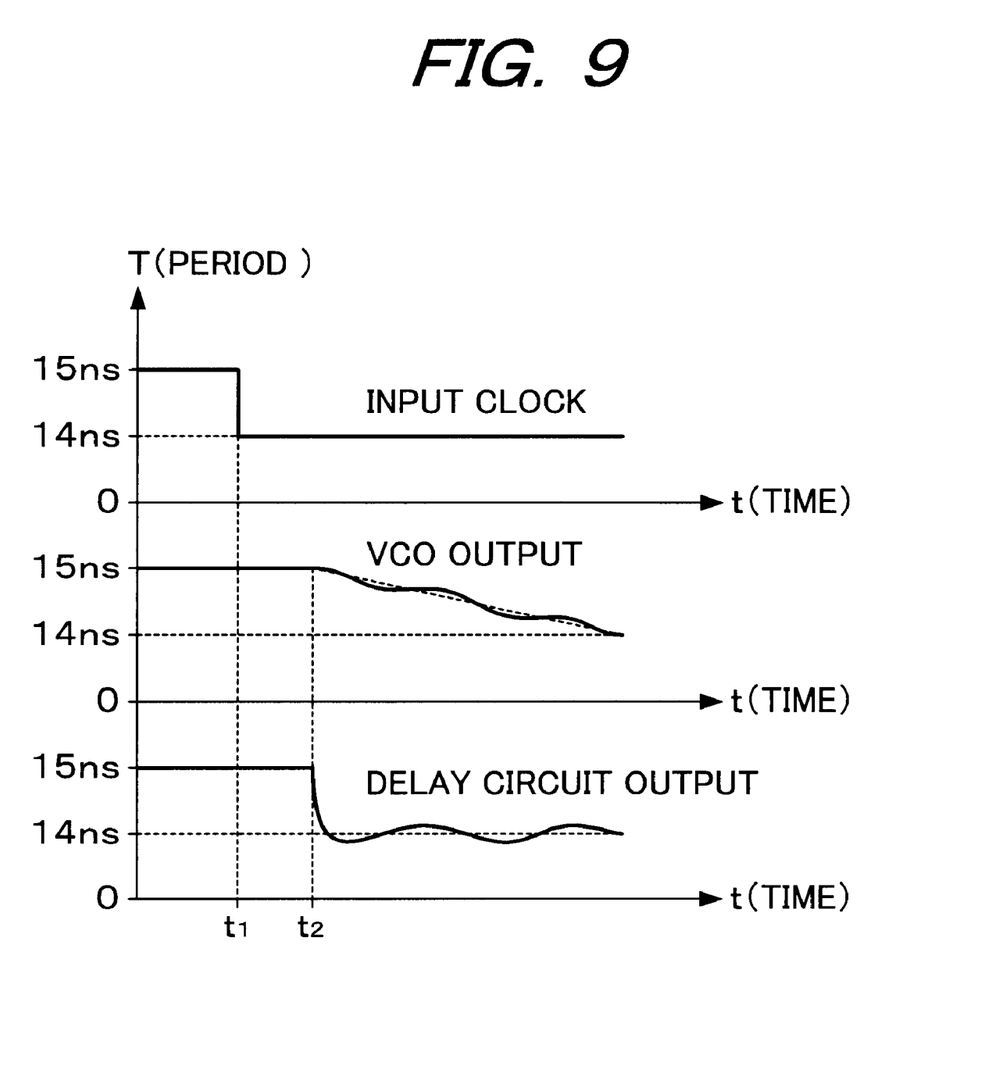
FIG. 9 shows the following capability of the outputs of the VCO and the delay circuit with respect to changes in the period of the input clock signal.

The capability of the outputs of the VCO 14 and the delay circuit 15 to follow changes in the period of the input clock signal are shown in FIG. 9. Time (t) is plotted along the horizontal axis in FIG. 9 and the period (T) of the input clock signal is plotted along the vertical axis. If the period (T) of the input clock signal has changed from 15 ns to 14 ns at a time t1, the center value of the period at the output of the VCO 14 starts to follow the input clock signal from a time t2, after a delay. However, the response does not follow the input clock signal instantly at the time t2, but a certain time is required to follow it. In contrast thereto, the center value of the period at the output of the delay circuit 15 follows the input clock signal instantly at the time t2, after the delay.

If the multi-phase output clock signals from the delay circuit 15 are used as sampling clocks to implement parallel/serial conversion in the parallel/serial conversion block 79 of FIG. 10, therefore, any changes in the period of the input clock signal can be followed directly, enabling sampling of parallel data. In a similar manner, if the multi-phase output clock signals from the delay circuit 15 are used as sampling clocks to implement serial/parallel conversion in the serial/parallel conversion block 80 of FIG. 10, any changes in the period of the input clock signal can be followed directly, enabling conversion of serial data into parallel data.

What is claimed is:

1. A clock generation circuit which generates multi-phase output clock signals based on an input clock signal, the clock generation circuit comprising:
    a voltage-controlled oscillator which oscillates an output signal having a frequency that varies in accordance with a control voltage;
    a phase comparator which compares the phase of the input clock signal and the phase of the output signal of the voltage-controlled oscillator, to detect a phase difference between the phases;
    a control voltage generation circuit which generates the control voltage in accordance with the phase difference detected by the phase comparator; and
    a variable delay circuit which generates the multi-phase output clock signals by delaying the input clock signal in accordance with the control voltage,
    wherein the voltage-controlled oscillator comprises a plurality of differential buffer circuits connected in a ring shape;
    the variable delay circuit comprises a plurality of differential buffer circuits of a same configuration as the plurality of differential buffer circuits comprised within the voltage-controlled oscillator; and
    the voltage-controlled oscillator has n of the differential buffer circuits and the variable delay circuit has at least 2n of the differential buffer circuits.

2. The clock generation circuit as defined in claim 1, wherein the multi-phase output clock signals are generated on the basis of outputs from odd-numbered differential buffer circuits from among the at least 2n differential buffer circuits.

3. The clock generation circuit as defined in claim 2, wherein the voltage-controlled oscillator and the variable delay circuit are formed on the same semiconductor substrate.

4. The clock generation circuit as defined in claim 1, wherein the multi-phase output clock signals are generated on the basis of outputs from even-numbered differential buffer circuits from among the at least 2 n differential buffer circuits.

5. The clock generation circuit as defined in claim 4, wherein the voltage-controlled oscillator and the variable delay circuit are formed on the same semiconductor substrate.

6. The clock generation circuit as defined in claim 1, wherein the voltage-controlled oscillator and the variable delay circuit are formed on the same semiconductor substrate.

7. The clock generation circuit as defined in claim 1, wherein the voltage-controlled oscillator and the variable delay circuit are formed on the same semiconductor substrate.

8. A serial/parallel conversion device which converts serial data, which is input in accordance with an input clock signal, into parallel data, the serial/parallel conversion device comprising:
    a serial/parallel conversion block which converts the serial data into the parallel data in accordance with sampling clocks; and
    a clock generation circuit which generates multi-phase output clock signals based on the input clock signal and supplying the multi-phase output clock signals to the serial/parallel conversion block as the sampling clocks,
    wherein the clock generation circuit comprises:
    a voltage-controlled oscillator which oscillates an output signal having a frequency that varies in accordance with a control voltage;
    a phase comparator which compares the phase of the input clock signal and the phase of the output signal of the voltage-controlled oscillator, to detect a phase difference between the phases;
    a control voltage generation circuit which generates the control voltage in accordance with the phase difference detected by the phase comparator; and
    a variable delay circuit which generates the multi-phase output clock signals by delaying the input clock signal in accordance with the control voltage,
    wherein n bits of the serial data are sent within one cycle of the input clock signal;
    the voltage-controlled oscillator comprises n differential buffer circuits connected into a ring; and
    the variable delay circuit comprises at least 2 n differential buffer circuits of the same configuration as the n differential buffer circuits comprised within the voltage-controlled oscillator.

9. A semiconductor device having the voltage-controlled oscillator and the variable delay circuit as defined in claim 8 which are formed on the same semiconductor substrate.

10. A parallel/serial conversion device which converts parallel data, which is input in accordance with an input clock signal, into serial data, the parallel/serial conversion device comprising:
    a parallel/serial conversion block which converts the parallel data into the serial data in accordance with sampling clocks; and
    a clock generation circuit which generates multi-phase output clock signals based on the input clock signal and supplying the multi-phase output clock signals to the parallel/serial conversion block as the sampling clocks,
    wherein the clock generation circuit comprises:
    a voltage-controlled oscillator which oscillates an output signal having a frequency that varies in accordance with a control voltage;

a phase comparator which compares the phase of the input clock signal and the phase of the output signal of the voltage-controlled oscillator, to detect a phase difference between the phases;

a control voltage generation circuit which generates the control voltage in accordance with the phase difference detected by the phase comparator; and a variable delay circuit which generates the multi-phase output clock signals by delaying the input clock signal in accordance with the control voltage, wherein n bits of the serial data are sent within one cycle of the input clock signal;

the voltage-controlled oscillator comprises n differential buffer circuits connected into a ring; and the variable delay circuit comprises at least 2 n differential buffer circuits of the same configuration as the n differential buffer circuits comprised within the voltage-controlled oscillator.

11. A semiconductor device having the voltage-controlled oscillator and the variable delay circuit as defined in claim 10 which are formed on the same semiconductor substrate.

* * * * *